(12) United States Patent
Thompson et al.

(10) Patent No.: US 11,710,060 B2
(45) Date of Patent: Jul. 25, 2023

(54) QUANTUM PROCESSING SYSTEM

(71) Applicant: The Boeing Company, Chicago, IL (US)

(72) Inventors: Richard Joel Thompson, Huntsville, AL (US); Marna M. Kagele, Kenmore, WA (US)

(73) Assignee: The Boeing Company, Arlington, VA (US)

(*) Notice: Subject to any disclaimer, the term of this patent is extended or adjusted under 35 U.S.C. 154(b) by 459 days.

(21) Appl. No.: 16/904,518

(22) Filed: Jun. 17, 2020

(65) Prior Publication Data

US 2021/0398007 A1 Dec. 23, 2021

(51) Int. Cl.
*G06N 10/00* (2022.01)
*G06F 30/20* (2020.01)

(52) U.S. Cl.
CPC ............. *G06N 10/00* (2019.01); *G06F 30/20* (2020.01)

(58) Field of Classification Search
CPC ........... G06N 10/00; G06F 30/20; G06F 8/47; B82Y 10/00
See application file for complete search history.

(56) References Cited

PUBLICATIONS

Steiger et al. "ProjectQ: An Open Source Software Framework for Quantum Computing", Jan. 31, 2018, Institute for Theoretical Physics. (Year: 2018).*

Haner et al., "A Software Methodology for Compiling Quantum Programs," Apr. 5, 2016, 14 pages, accessed Mar. 23, 2022, available at https://arxiv.org/abs/1604.01401.
Steiger et al., "ProjectQ: An Open Source Software Framework for Quantum Computing," Dec. 23, 2016, 11 pages, accessed Mar. 23, 2022, available at https://arxiv.org/abs/1612.08091.
Waters, "Program Translation via Abstraction and Reimplementation," IEEE Transactions on Software Engineering, vol. 14, No. 8, Aug. 1, 1988, pp. 1207-5589.
Extended European Search Report (EESR) dated Nov. 26, 2021, regarding U.S. Appl. No. 21/174,495, 11 pages.

* cited by examiner

*Primary Examiner* — Jung Kim
(74) *Attorney, Agent, or Firm* — Yee & Associates, P.C.

(57) ABSTRACT

A method, apparatus, system, and computer program product for quantum processing. A target quantum programming for a process for a quantum computer is identified. A universal gate set is selected based on a computer type. Any operation possible for a particular quantum computer can be performed using the universal gate set. Instructions for the process in a source quantum programming language are sent to a source quantum language translator which outputs a digital model representation of quantum computer components that are arranged to perform the process using the instructions. The digital model representation of the quantum computer components and the universal gate set are sent to a target quantum language translator, which outputs the instructions for operations for the process in a target quantum programming language using the digital model representation of the quantum computer components and the universal gate set for the computer type for the quantum computer.

30 Claims, 8 Drawing Sheets

QUANTUM PROCESSING SYSTEM

BACKGROUND INFORMATION

1. Field

The present disclosure relates generally to an improved computer system and, in particular, to a method, apparatus, system, and computer program product for managing an execution of quantum processes for quantum computers.

2. Background

A quantum computer is a computer that executes sequences of instructions in a quantum mechanical system. These instructions are for processes also referred to as quantum algorithms. The processes involve quantum mechanical phenomena such as superposition and entanglement to perform computations. The quantum computer can employ sophisticated programming to effectively use processing capabilities for solving problems.

Quantum computers can provide computing advantages for tasks including those such as optimization, machine learning, cryptography, and other tasks. Different types of quantum computers exist. For example, one computer can take a form of an ion trap quantum computer, a superconducting quantum computer, a topological quantum computer, or other types of quantum computer architectures. These different architectures can have different development tools, stacks, and programming languages.

With the presence of multiple computer types for quantum computers, development tools, and programming languages, creating processes such as quantum algorithms and implementing them in different languages and hardware can be time-consuming and challenging.

Therefore, it would be desirable to have a method and apparatus that take into account at least some of the issues discussed above, as well as other possible issues. For example, it would be desirable to have a method and apparatus that overcome a technical problem with quantum processing in quantum computers.

SUMMARY

An embodiment of the present disclosure provides a quantum processing system comprising a computer system; a set of quantum language translators in the computer system; universal gate sets; and a process manager in the computer system. The set of quantum language translators is configured to convert instructions for operations in quantum programming languages into a digital model representation of quantum computer components arranged to perform the operations and to convert the digital model representation of the quantum computer components arranged to perform the operations into the instructions for the operations in the quantum programming languages for execution in quantum computers. Each quantum language translator in the set of quantum language translators is for a particular quantum programming language in the quantum programming languages. Any operation possible for a particular quantum computer can be performed using a number of gates in a universal gate set in the universal gate sets. The process manager is configured to send the instructions in a quantum programming language to a quantum language translator in the set of quantum language translators. The quantum language translator is configured to handle the quantum programming language and outputs the digital model representation of the quantum computer components. The process manager is configured to send the digital model representation of the quantum computer components to the quantum language translator such that the quantum language translator outputs the instructions for the operations in the quantum programming language using the universal gate selected for a computer type for the particular quantum computer.

Another embodiment of the present disclosure provides a quantum processing system comprising a computer system; a set of quantum language translators in the computer system; and a process manager in the computer system. The set of quantum language translators is configured to convert instructions for operations in quantum programming languages into a digital model representation of quantum computer components arranged to perform the operations and to convert the digital model representation of the quantum computer components arranged to perform the operations into the instructions for the operations in the quantum programming languages for execution in quantum computers. Each quantum language translator in the set of quantum language translators is for a particular quantum programming language in the quantum programming languages. The process manager is configured to receive the instructions in a quantum programming language in the quantum programming languages. The process manager is configured to send the instructions in a quantum programming language to a quantum language translator in the set of quantum language translators. The quantum language translator is configured to handle the quantum programming language and outputs the digital model representation of quantum computer components. The process manager is configured to send the digital model representation of the quantum computer components to the quantum language translator such that the quantum language translator outputs the instructions for the operations in the quantum programming language.

Still another embodiment of the present disclosure provides a method for quantum processing. A target quantum programming for a process for a quantum computer is identified by a computer system. A universal gate set is selected by the computer system from universal gate sets based on a computer type for the quantum computer, wherein any operation possible for a particular quantum computer can be performed using a number of gates in the universal gate set. Instructions for the process in a source quantum programming language are sent by the computer system to a source quantum language translator in a set of quantum language translators, wherein the source quantum language translator outputs a digital model representation of quantum computer components that are arranged to perform the process using the instructions. The digital model representation of the quantum computer components and the universal gate set selected are sent by the computer system to a target quantum language translator such that the quantum language translator outputs the instructions for the operations in the target quantum programming language using the digital model representation of the quantum computer components and the universal gate selected for the computer type for the quantum computer.

Yet another embodiment of the present disclosure provides a computer program product for quantum processing. The computer program product comprises first program code, second program code, third program code, and fourth program code stored on a computer-readable storage media. The first program code is executable by a computer system to cause the computer system to identify a target quantum programming language for a process for a quantum computer. The second program code is executable by the computer system to cause the computer system to select a universal gate set from universal gate sets based on a computer type for the quantum computer. Any operation possible for a particular quantum computer can be performed using a number of gates in the universal gate set. The third program code is executable by the computer system to cause the computer system to send instructions for the process in a source quantum programming language to a source quantum language translator in a set of quantum language translators. The source quantum language translator outputs a digital model representation of quantum computer components that are arranged to perform the process using the instructions. The fourth program code is executable by the computer system to cause the computer system to send the digital model representation of the quantum computer components and the universal gate set selected to a target quantum language translator such that the quantum language translator outputs the instructions for the operations in the target quantum programming language using the digital model representation of the quantum computer components and the universal gate selected for the computer type for the quantum computer.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. For example, the illustrative embodiments recognize and take into account that current techniques for implementing processes in quantum computers can be more difficult than desired. For example, the illustrative embodiments recognize and take into account that current techniques manually construct separate instructions in instructions for quantum programs in which each program is in a separate stack or hardware in the programming language for the particular one computer. Those embodiments recognize and take into account that the complexity of these implementations can be error-prone and time-consuming.

The illustrative embodiments also recognize and take into account that two different programs for quantum computers may implement the same process differently. These different implementations of the same process can lead to discrepancies in benchmarking in comparison of different types of quantum computers that may be evaluated.

Figure 1:
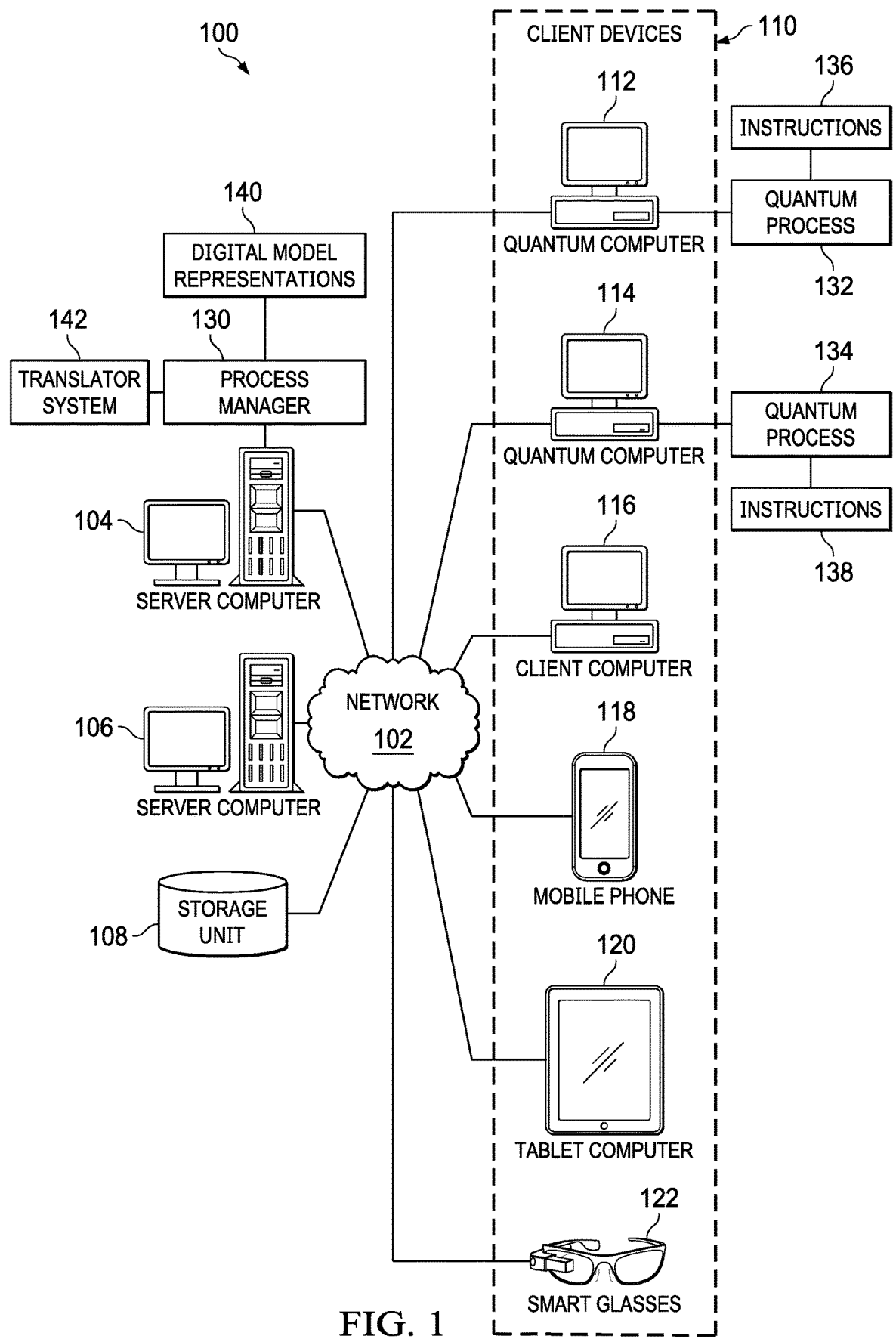
FIG. 1 is a pictorial representation of a network of data processing systems in which illustrative embodiments may be implemented.

With reference now to the figures and, in particular, with reference to FIG. 1, a pictorial representation of a network of data processing systems is depicted in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server computer 104 and server computer 106 connect to network 102 along with storage unit 108. In addition, client devices 110 connect to network 102. As depicted, client devices 110 include quantum computer 112, quantum computer 114, and client computer 116. Client devices 110 can be, for example, computers, workstations, or network computers. In the depicted example, server computer 104 provides information, such as boot files, operating system images, and applications to client devices 110. Further, client devices 110 can also include other types of client devices such as mobile phone 118, tablet computer 120, and smart glasses 122. In this illustrative example, server computer 104, server computer 106, storage unit 108, and client devices 110 are network devices that connect to network 102 in which network 102 is the communications media for these network devices. Some or all of client devices 110 may form an Internet-of-things (IoT) in which these physical devices can connect to network 102 and exchange information with each other over network 102.

Client devices 110 are clients to server computer 104 in this example. Network data processing system 100 may include additional server computers, client computers, and other devices not shown. Client devices 110 connect to network 102 utilizing at least one of wired, optical fiber, or wireless connections.

Program code located in network data processing system 100 can be stored on a computer-recordable storage media and downloaded to a data processing system or other device for use. For example, program code can be stored on a computer-recordable storage media on server computer 104 and downloaded to client devices 110 over network 102 for use on client devices 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers consisting of thousands of commercial, governmental, educational, and other computer systems that route data and messages. Of course, network data processing system 100 also may be implemented using a number of different types of networks. For example, network 102 can be comprised of at least one of the Internet, an intranet, a local area network (LAN), a metropolitan area network (MAN), or a wide area network (WAN). FIG. 1 is intended as an example, and not as an architectural limitation for the different illustrative embodiments.

As used herein, "a number of," when used with reference to items, means one or more items. For example, "a number of different types of networks" is one or more different types of networks.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In this illustrative example, quantum computer 112 and quantum computer 114 are client devices 110 that can run processes such as quantum algorithms. As depicted, quantum computer 112 and quantum computer 114 are different types of quantum computers. In other words, these quantum computers are constructed with different types of architectures. In this illustrative example, quantum computer 112 is a superconducting quantum computer while quantum computer 114 is an ion trap quantum computer.

A quantum program can be run on these two quantum computers and the performance of the computers can be compared. These comparisons can be part of a benchmarking process to compare the performance of the different hardware architectures used to implement quantum computer 112 and quantum computer 114. With the benchmarking process, it is desirable for a program to perform the same process in both of these quantum computers to obtain information for comparing the performance of quantum computer 112 and quantum computer 114.

Further, in other illustrative examples, these two quantum computers may be available for processing tasks. If both quantum computers are employed to process the same types of tasks, these quantum computers may be part of a shared or grid computing system. When these two quantum computers are used for distributed processing to solve a problem, programs can be distributed to quantum computer 112 and quantum computer 114 that perform the process using different programming languages. These programming languages can be based on the computer type of the quantum computers.

In this illustrative example, process manager 130 is located in server computer 104. As depicted, process manager 130 can operate to manage processes. For example, process manager 130 can manage the running of quantum process 132 on quantum computer 112 and quantum process 134 running on quantum computer 114.

In this illustrative example, quantum process 132 and quantum process 134 are comprised of instructions in one or more quantum processing languages. As depicted, instructions 136 for quantum process 132 can be in a different quantum programming language from instructions 138 for quantum process 134.

In managing quantum process 132 and quantum process 134, process manager 130 may distribute the same process to these quantum computers. The same process may be run on the quantum computers for purposes of determining the performance of these quantum computers in running the same process. As another example, the same process may be used to perform tasks for shared processing such as grid computing.

However, instructions 136 and instructions 138 for the same process may be different. The different instructions may result from at least one of a different programming language or different hardware components in quantum computer 112 and quantum computer 114.

In this illustrative example, process manager 130 utilizes digital model representations 140 of hardware components arranged to perform the operations for processes. In this illustrative example, process manager 130 can use translator system 142 to translate a digital model representation in digital model representations 140 for a process into instructions 136 and instructions 138. In this manner, a single process can be turned into instructions for execution on different hardware systems such as quantum computer 112 and quantum computer 114 that may be of different computer types.

In one illustrative example, a process can be developed using instructions. When the process is ready for distribution to systems such as quantum computer 112 and quantum computer 114, the instructions can be turned into a digital model representation by process manager 130 using quantum program translators in translator system 142. The digital model representation can then be used to generate instructions 136 and instructions 138 that are distributed to quantum computer 112 and quantum computer 114, respectively, for execution. In this manner, a need for duplicating efforts to derive programs in different languages or for different implementations can be reduced. Further, with process manager 130, overall quality of processes distributed in different languages to different hardware systems can be improved from a unified source for generating instructions consistently using process manager 130.

Figure 2:
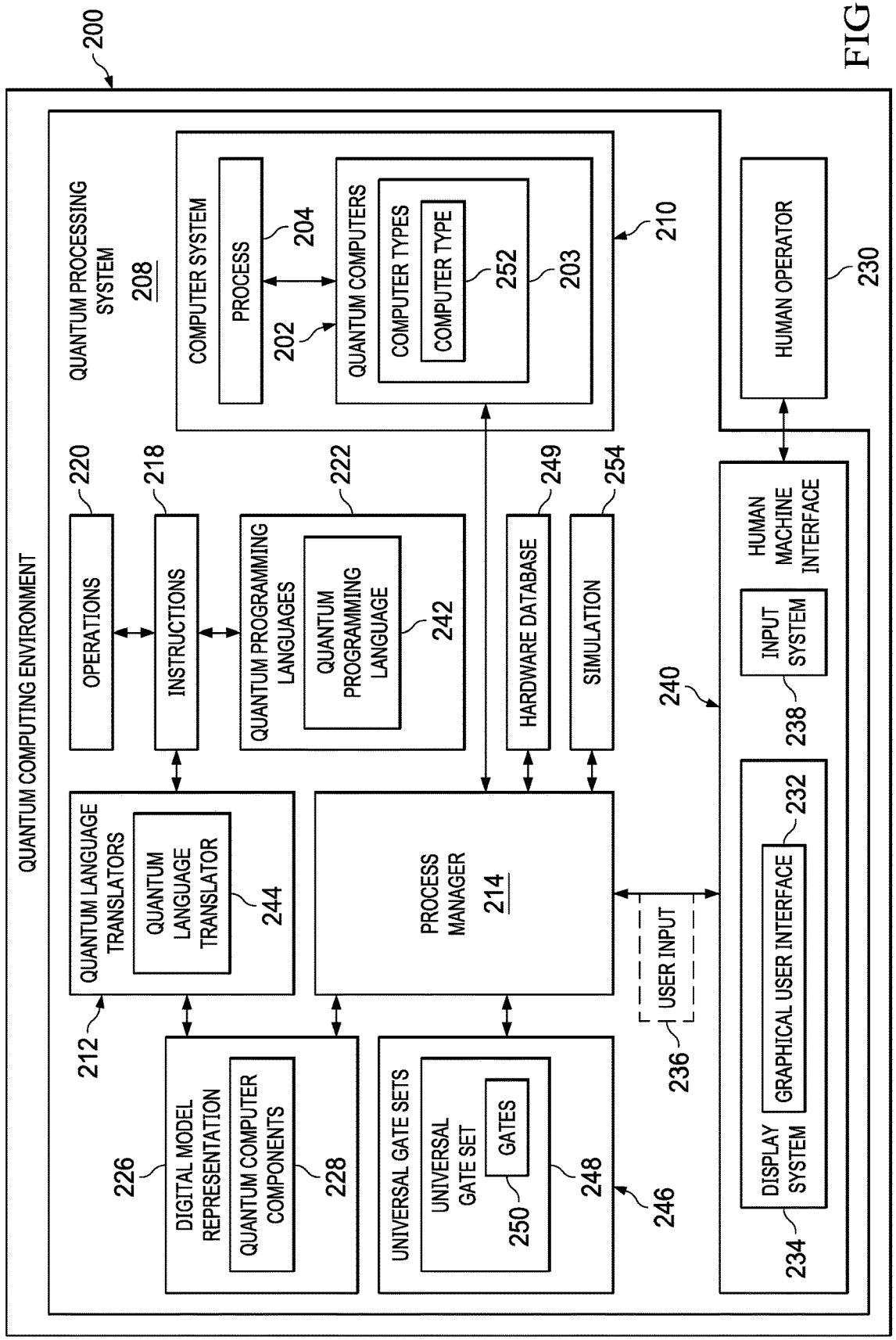
FIG. 2 is a block diagram of a quantum computing environment in accordance with an illustrative embodiment.

With reference now to FIG. 2, a block diagram of a quantum computing environment is depicted in accordance with an illustrative embodiment. In this illustrative example, quantum computing environment 200 includes components that can be implemented in hardware such as the hardware shown in network data processing system 100 in FIG. 1.

In this illustrative example, quantum computers 202 in quantum computing environment 200 can each run process 204. Quantum computers 202 can take a number of different forms. For example, quantum computers 202 can have computer types 203 that are the same or different from each other. In other words, a quantum computer in quantum computers 202 can have at least one of different physical hardware, architecture, or other features that may have constraints as to how operations can be performed as compared to other quantum computers in quantum computers 202 of different ones of computer types 203. In the illustrative example, computer types 203 can be selected from at least one of a superconducting quantum computer, an ion trap quantum computer, a topological quantum computer, a quantum dot quantum computer, an optical lattice quantum computer, a cavity quantum electrodynamic quantum computer, a nuclear magnetic resonance quantum computer, a nitrogen vacancy diamond quantum computer, a hybrid quantum computer combining one or more types of quantum computers, or some other type of quantum computer.

As depicted, process 204 can be operations that are performed for at least one of a quantum algorithm, a subroutine, a function, or some other type of process. For example, process 204 may be a single quantum algorithm or multiple quantum algorithms or subroutines.

In this illustrative example, quantum processing by quantum computers 202 can be managed by quantum processing system 208. In this illustrative example, quantum processing system 208 comprises computer system 210, a set of quantum language translators 212, and process manager 214.

As used herein, "a set of," when used with reference to items, means one or more items. For example, "a set of different types of quantum language translators 212" is one or more of different types of quantum language translators 212.

As depicted, the set of quantum language translators 212 is in computer system 210. The set of quantum language translators 212 is configured to convert instructions 218 for operations 220 in quantum programming languages 222 into digital model representation 226 of quantum computer components 228 arranged to perform operations 220. The set of quantum language translators 212 is also configured to convert quantum computer components 228 in digital model representation 226 into instructions 218 for operations 220 in quantum programming languages 222 for execution in quantum computers 202. Quantum computer components 228 are components in quantum computers 202 that operate to perform operations 220 for process 204 in this illustrative example.

In this illustrative example, operations 220 are operations that are performed for process 204. In this illustrative example, each quantum language translator in the set of quantum language translators 212 is for a particular quantum programming language in quantum programming languages 222. As depicted, quantum computer components 228 in digital model representation 226 are connected to each other in a manner such that the arrangement of quantum computer components 228 including their connections perform operations 220 for process 204.

In this illustrative example, digital model representation 226 is a data structure used by process manager 214. In other illustrative examples, digital model representation 226 can be displayed to human operator 230 in graphical user interface 232 in display system 234.

Display system 234 is a physical hardware system and includes one or more display devices on which graphical user interface 232 can be displayed. The display devices can include at least one of a light emitting diode (LED) display, a liquid crystal display (LCD), an organic light emitting diode (OLED) display, a computer monitor, a projector, a flat panel display, a heads-up display (HUD), or some other suitable device that can output information for the visual presentation of information.

Human operator 230 is a person that can interact with graphical user interface 232 through user input 236 generated by input system 238 for computer system 210. Input system 238 is a physical hardware system and can be selected from at least one of a mouse, a keyboard, a trackball, a touchscreen, a stylus, a motion sensing input device, a gesture detection device, a cyber glove, or some other suitable type of input device. Display system 234 and input system 238 form human machine interface (HMI) 240.

As depicted, process manager 214 can be implemented in software, hardware, firmware, or a combination thereof. When software is used, the operations performed by process manager 214 can be implemented in program code configured to run on hardware, such as a processor unit. When firmware is used, the operations performed by process manager 214 can be implemented in program code and data and stored in persistent memory to run on a processor unit. When hardware is employed, the hardware can include circuits that operate to perform the operations in process manager 214.

In the illustrative examples, the hardware can take a form selected from at least one of a circuit system, an integrated circuit, an application specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field programmable logic array, a field programmable gate array, and other suitable hardware devices. Additionally, the processes can be implemented in organic components integrated with inorganic components and can be comprised entirely of organic components excluding a human being. For example, the processes can be implemented as circuits in organic semiconductors.

Computer system 210 is a physical hardware system and includes one or more data processing systems. When more than one data processing system is present in computer system 210, those data processing systems are in communication with each other using a communications medium. The communications medium can be a network. The data processing systems can be selected from at least one of a computer, a server computer, a tablet computer, or some other suitable data processing system.

During operation, process manager 214 can send instructions 218 in quantum programming language 242 in quantum programming languages 222 to quantum language translator 244 in the set of quantum language translators 212. Quantum language translator 244 is configured to handle quantum programming language 242 and outputs digital model representation 226 of quantum computer components 228.

Additionally, process manager 214 can send digital model representation 226 of quantum computer components 228 to quantum language translator 244 such that quantum language translator 244 outputs instructions 218 for operations 220 in quantum programming language 242.

In this illustrative example, quantum processing system 208 can also include universal gate sets 246. Universal gates sets 246 can be selected from at least one of Hadamard gates, phase (S) gates, Controlled-X (CNOT) gates, and Toffoli gates; Hadamard gates, phase (S) gates, π/8 (T) gates, and a Controlled-X (CNOT) gate; a Barenco gate (B); a Deutsch gate (D_θ) gate; rotation gates $R\_x$ (θ), $R\_y$ (θ); rotation gates R_x (θ), R_y (θ), a Controlled-Z (CZ) gate, or some other suitable type of gate set. In some illustrative examples, two or more of universal gate sets 246 can be combined. These combinations of universal gate sets 246 can be performed using mathematical operations such as intersection and union to obtain a combination of universal gate sets 246 that can be used to perform the desired operations.

Universal gate set 248 in universal gate sets 246 comprises different types of gates 250. With gates 250 in universal gate set 248, any operation possible for a particular quantum computer in quantum computers 202 can be performed using a number of gates 250 in universal gate set 248 in universal gate sets 246. In the illustrative example, the order of gates 250 can be selected to perform operations for process 204. The number of gates 250 can be an ordered sequence of gates 250 in which the ordered sequence is a successive order of gates 250 selected to perform operations for process 204.

With availability of universal gate sets 246, quantum language translator 244 can output instructions 218 for operations 220 in quantum programming language 242 using digital model representation 226 and universal gate set 248 selected for a particular quantum computer in quantum computers 202 using digital model representation 226. The selection of universal gate set 248 can be based on computer type 252 in computer types 203 for a particular quantum computer in quantum computers 202. As depicted, process manager 214 can determine universal gate set 248 in universal gate sets 246 selected for use using hardware database 249.

In the illustrative example, hardware database 249 can contain information identifying universal gate sets 246 with respect to computer types 203 for quantum computers 202. For example, hardware database 249 can identify all universal gate sets compatible with a particular computer type. As another example, hardware database 249 can identify universal gate sets that are optimal for a particular computer type as well as universal gate sets that are not fully supported by a particular computer type. The optimal universal gate set for a particular computer type can be based on a set of performance parameters selected from at least one of speed, accuracy, resource use, circuit depth, gate performance, gate error, or other performance parameters. As a result, depending on a performance parameter or performance parameters selected, a different universal gate set may be selected for use for a quantum computer with a particular computer type.

As a result, universal gate set 248 can be selected by process manager 214 using hardware database 249 to provide a desired level of performance for a particular quantum computer. The performance can be selected from at least one of accuracy, speed, hardware support, circuit depth, noise or error rates, gate performance, or other performance factors.

In this illustrative example, process manager 214 can send a selection of universal gate sets 246 to quantum language translator 244 with digital model representation 226.

In the illustrative example, digital model representation 226 containing quantum computer components 228 can be created using a mechanism other than sending instructions 218 to quantum language translator 244. For example, digital model representation 226 of quantum computer components 228 can be created from user input 236 generated by human operator 230 interacting with human machine interface 240. Quantum computer components 228 in digital model representation 226 can be displayed in graphical user interface 232 in display system 234 in response to user input 236 generated by human operator 230 operating human machine interface 240. In this manner, a visualization of digital model representation 226 can be displayed in graphical user interface 232.

Further, process manager 214 can also perform simulation 254 from digital model representation 226. In this manner, human operator 230 can develop process 204 through a visual process in which human operator 230 interacts with the display of quantum computer components 228 in digital model representation 226 in graphical user interface 232.

Thus, in the illustrative example, process manager 214 can operate in various modes to enable more efficient and accurate quantum computing as compared to using current techniques. For example, process manager 214 can perform simulation 254 using digital model representation 226 that embodies process 204. In this example, results of simulation 254 can be displayed through human machine interface 240 as simulation 254 is performed as well as when simulation 254 is completed. Simulation 254 of digital model representation 226 can enable human operator 230 to inspect the behavior of a quantum algorithm implemented in process 204. In this manner, human operator 230 can determine whether the quantum algorithm operates as desired. With simulation 254, human operator 230 can make changes to digital model representation 226 and rerun simulation 254 with the changes. As a result, human operator 230 can modify and refine digital model representation 226 until human operator 230 is satisfied with the results from simulation 254 of digital model representation 226.

With the final version of digital model representation 226, this model can be used to generate instructions 218 for a set of quantum computers 202 using quantum language translators 212. The generation of instructions 218 can be performed more consistently and with less errors using quantum language translators 212 as compared to current techniques in which program code is generated separately for different quantum computers.

With quantum processing system 208, identification of optimal quantum algorithms can be simulated and explored. This feature in quantum processing system 208 can aid in decision-making processes to identify a physical system such as a particular quantum computer in quantum computers 202 that provides the desired performance for a particular use. By generating instructions 218 for different computer types in quantum computers 202 from a single source such as digital model representation 226, time needed to generate instructions 218 for the different types of quantum computers 202 can be reduced. Further, the quality of instructions 218 generated for the different types of quantum computers 202 can be increased as compared to current techniques.

Figure 3:
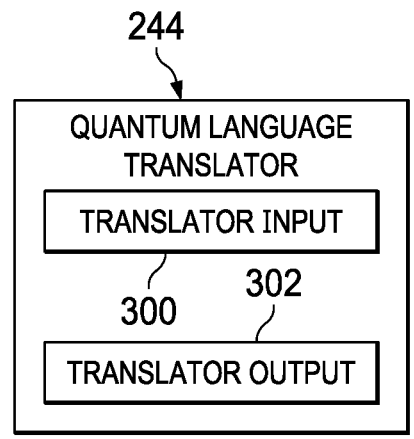
FIG. 3 is an illustration of a block diagram of a quantum language translator in accordance with an illustrative embodiment.

With reference next to FIG. 3, an illustration of a block diagram of a quantum language translator is depicted in accordance with an illustrative embodiment. In the illustrative examples, the same reference numeral may be used in more than one figure. This reuse of a reference numeral in different figures represents the same element in the different figures.

As depicted, quantum language translator 244 is configured to provide translations between instructions 218 in FIG. 2 and digital model representation 226 in FIG. 2 for quantum programming language 242 in quantum programming languages 222. Each quantum language translator in quantum language translators 212 can be for a different quantum programming language in quantum programming languages 222. In some examples, more than one quantum language translator can be present for the same quantum language depending on the use of particular quantum language translators.

In the illustrative example, quantum language translator 244 can include a number of different components. As depicted, quantum language translator 244 comprises translator input 300 and translator output 302.

As depicted, translator input 300 is configured to receive instructions 218 in quantum programming language 242 for quantum language translator 244. In response to receiving instructions 218, translator input 300 outputs digital model representation 226 comprising quantum computer components 228. Quantum computer components 228 can be a gate, a memory, an operation, a subroutine, state information, a circuit, a memory, or other hardware or software components.

In this illustrative example, translator output 302 is configured to receive digital model representation 226 of quantum computer components 228 sent to quantum language translator 244. Translator output 302 outputs instructions 218 for operations 220 in quantum programming language 242 using digital model representation 226. Further, instructions 218 that are output can also be performed using universal gate set 248. Universal gate set 248 can be received from a selection made by process manager 214. In other illustrative examples, universal gate set 248 can be a default gate set used by quantum language translator 244.

Figure 4:
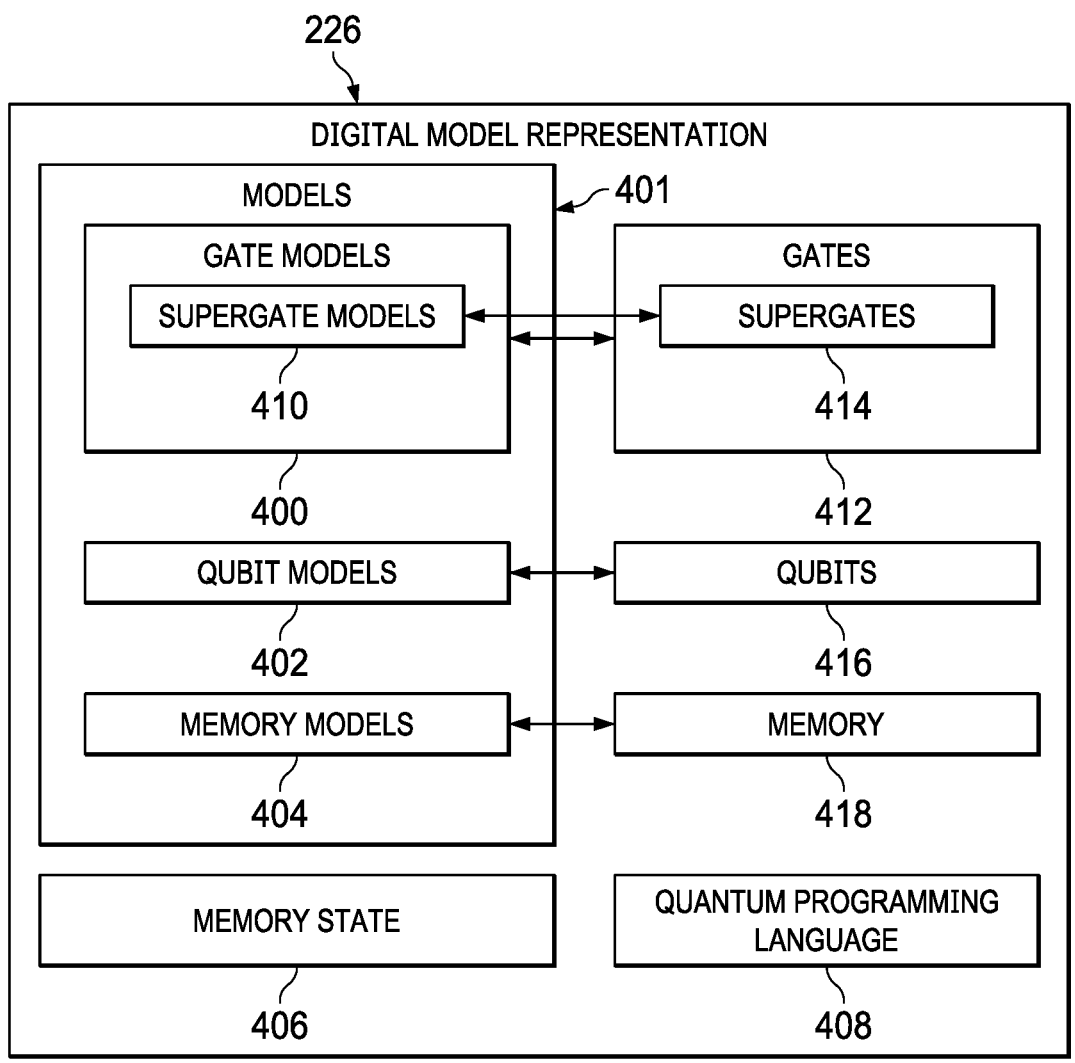
FIG. 4 is an illustration of a block diagram of quantum computer components in a digital model representation in accordance with an illustrative embodiment.

With reference next to FIG. 4, an illustration of a block diagram of quantum computer components in a digital model representation is depicted in accordance with an illustrative embodiment. An example of one implementation for digital model representation 226 in FIG. 2 is depicted in this figure.

As shown, digital model representation 226 includes a number of different quantum computer components defined by models and other information. As depicted, quantum computer components 228 in FIG. 2 in digital model representation 226 can be defined by gate models 400 in models 401. Quantum computer components 228 can also be defined by models 401 selected from at least one of qubit models 402 or memory models 404. Digital model representation 226 can also include information selected from at least one of memory state 406, quantum program 408, or other suitable information.

In this illustrative example, gate models 400 define quantum computer components 228 in the form of gates 412. In this illustrative example, gates 412 represent operations that can be performed in a quantum process. Gates 412 are quantum logic gates which are referred to as "gates" in the illustrative examples. Each gate defined in gate models 400 can perform an operation on one or more qubits.

Gates 412 can be arranged to represent quantum computer components 228. The arrangement includes connections of gates 412 to each other such that the arrangement of gates 412 can perform operations 220 for process 204 in FIG. 2. Examples of gates 412 defined by gate models 400 include at least one of a Hadamard gate, a Pauli gate, a rotation gate, a Controlled-U gate, a phase gate, or other suitable types of gates.

Additionally, gate models 400 can also include a set of supergate models 410 that define supergates 414. A supergate defined in supergates 414 can be used to represent more complex operations. Supergates 414 are arrangements of gates as defined by supergate models 410. For example, a supergate can be a subroutine, a function, or some other suitable construct. A supergate in a set of supergates 414 comprises two or more gates 412. In the illustrative examples, the two or more gates 412 are in an ordered sequence. In other words, a supergate is a representation of two or more gates with connections between the gates such that the arrangements of the gates in the supergate perform operations for a routine, a subroutine, a function, or other operations within process 204.

In this illustrative example, supergate models 410 can be employed to remove coding of instructions that can involve tedious and error-prone manipulations. Further, the use of supergate models 410 allows reusability of subroutine units of at least one of program instructions or circuit arrangements represented as a supergate.

For example, quantum algorithms in process 204 in FIG. 2 can use a quantum phase estimation (QPE) algorithm as a single step in the larger algorithm to solve a problem. However, the implementation of the quantum phase estimation algorithm itself can be more difficult and time-consuming for a human operator to code instructions or arrange using individual gates in digital model representation 226 each time such an algorithm is needed.

With the illustrative example, a supergate can be present for a subroutine such as a quantum phase estimation. With the supergate for the quantum phase estimation, a human operator can quickly specify the use of the quantum phase estimation applied to a subset of qubits for a single qubit unitary gate, and with this supergate the instructions for quantum phase estimation can be automatically generated. Examples of other types of processes for subroutines that can be implemented as supergates include a quantum Fourier transform (QFT), an inverse quantum Fourier transform, and other suitable types of subroutines or processes.

In this illustrative example, qubit model 402 defines qubits 416 used in a quantum computer. A qubit is a basic unit of information in the quantum computer and can take different forms.

In this illustrative example, qubit model 402 can define one or more types of qubits 416 that may be used within a quantum computer. For example, qubit model 402 can include qubit types for qubits 416 selected from at least one an idealized qubit, an ion trap qubit, a neutral atom qubit, a superconducting qubit, an electron spin qubit, a photon polarization qubit, a dot spin qubit, or some other suitable type of qubit.

Memory model 404 defines memory 418 used in a quantum computer. For example, a memory model can define at least one of a type of memory, a memory size, or other information about memory 418. Memory 418 is used to store information such as qubits 416. Memory 418 can take a number of different forms as defined by memory model 404. For example, memory 418 can be selected from at least one of an ancillary memory, a temporary memory, a working memory, a noisy memory, a superposed state, an entangled state, or other suitable types or combinations of quantum memory.

As depicted, memory state 406 is information indicating an initial state for different quantum computer components such as memory in the quantum computer. For example, memory state 406 can indicate the initial state of qubits in memory 418. Further, quantum program 408 is the set of information composed of digital model representation 226 of components that represents the collection of operations 220 that are to be performed in a quantum computer.

Thus, instructions 218 can be executed by a set of quantum computers 202 for process 204 in which instructions 218 are in a desired form such as in a particular quantum programming language. In other words, each quantum computer in the set of quantum computers 202 can run the same process even when the set of quantum computers 202 is heterogeneous in architecture. In other words, the set of quantum computers 202 can have different hardware architectures and may support different quantum programming languages. With the use of process manager 214, a single process can be developed and distributed to many quantum computers and quantum computers 202 in a more efficient manner as compared to current techniques in which the process may be developed independently or separately in different languages. With process manager 214 using quantum language translators 212, process 204 can be distributed to different quantum computers in quantum computers 202 having different computer types.

Figure 5:
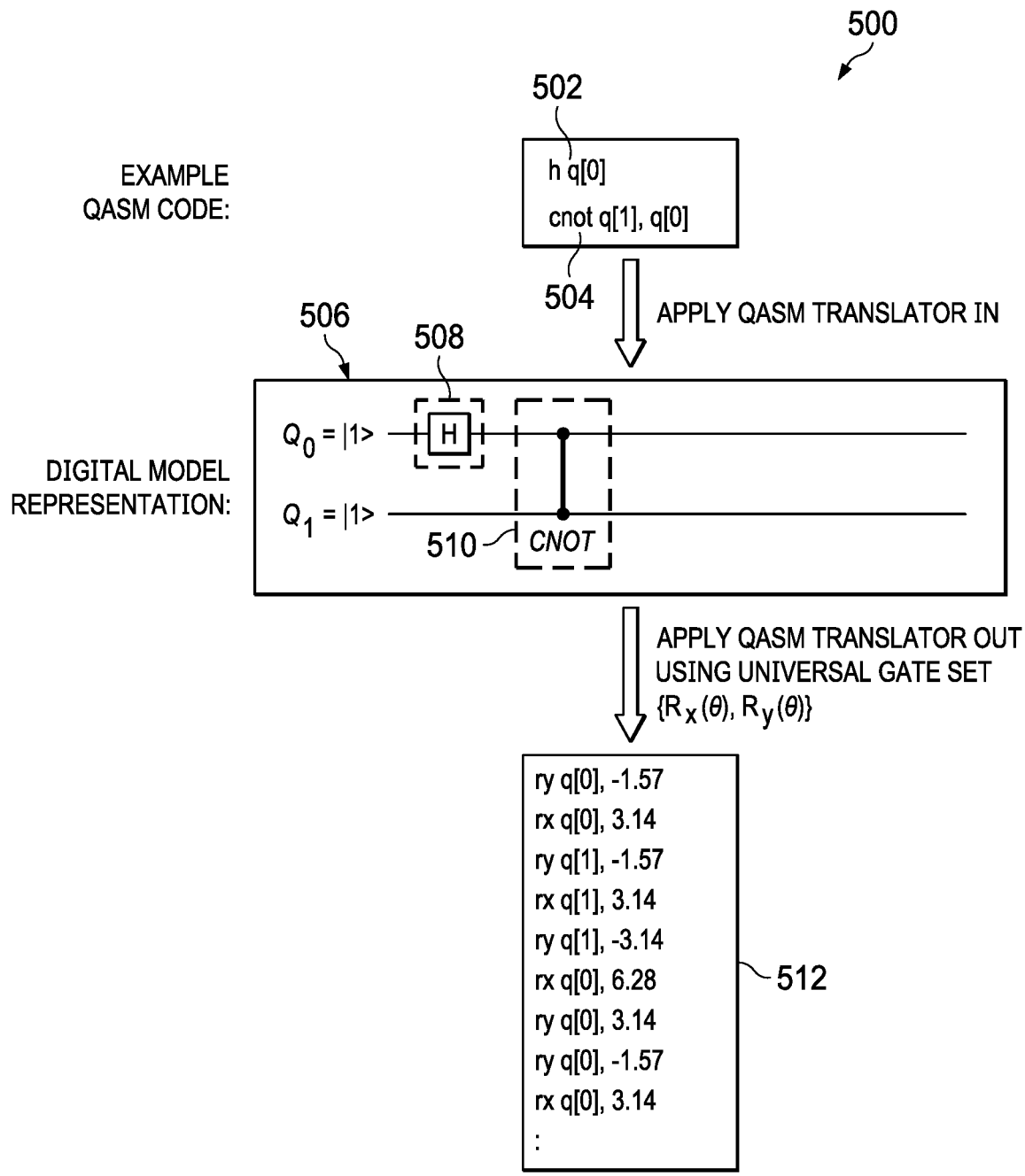
FIG. 5 is an illustration of a diagram of a generation of instructions in a target quantum programming language in accordance with an illustrative embodiment.

Turning next to FIG. 5, an illustration of a diagram of a generation of instructions in a target quantum programming language is depicted in accordance with an illustrative embodiment. In this illustrative example, instructions 500 are lines of code in quantum assembly language (QASM). Instructions 500 include Hadamard operation 502 and controlled-NOT operation 504. In this illustrative example, process manager 214 can apply translator input 300 from quantum language translator 244 for QASM to obtain digital model representation 506. In this illustrative example, digital model representation 506 includes two quantum computer components, Hadamard gate 508 and controlled-NOT gate 510.

In this example, instructions 512 can be generated by sending digital model representation 506 to translator output 302 of quantum language translator 244 for QASM. In this example, a different universal gate set is selected as compared to the universal gate set used in instructions 500 to obtain digital model representation 506. In this example, instructions 500 are processed by the quantum language translator using a universal gate set that only includes gates in the form of rotations. As a result, instructions 512 are code in which each line of code is a rotation. In this illustrative example, a common universal gate set for ion trap computers is selected. The selection can be made using hardware database 249 given a specification that ion trap hardware is used in the quantum computer on which instructions 512 are to be executed with a corresponding entry in the database indicating that a universal gate set of {Rx, Ry} is used for ion trap hardware.

In another illustrative example, circuit layout code is an example of another type of output that can be generated by a quantum language translator for circuit layouts using digital model representation 506 in FIG. 5. In this illustrative example, the instructions are in the form for circuit layout code that are used for defining a circuit layout that define a circuit for performing the operations. The circuit layout code can be for a circuit simulation program or used to select actual circuits for use in a quantum computer to perform the operations. The circuit layout code form of the instructions does not necessarily have a one-to-one corresponding with program code in the instructions that is generated for the digital model representation. In other words, instructions can take the form of code in at least one of a programming language or a code defining a circuit.

The illustrations of the data structures in FIG. 5 are provided as examples of one manner in which instructions can be converted into digital model representations and back into instructions. This illustration is not meant to limit the manner in which other illustrative examples can be implemented. For example, instructions 500 in FIG. 5 are only displayed as having two lines of code to avoid obscuring a description of the manner in which data is transformed between instructions and quantum computer components in a digital model representation in the illustrative examples. In other illustrative examples, hundreds or thousands of lines of code can be present in instructions 500. In a similar fashion, digital model representation 506 can be much more complex than displayed in this illustrative example.

In one illustrative example, one or more technical solutions are present that overcome a technical problem with quantum processing to perform operations for a process in multiple quantum computers. As a result, one or more technical solutions can provide a technical effect of enabling distribution of a process such as a quantum algorithm to multiple quantum computers having different hardware architectures more efficiently and accurately as compared to current techniques.

Computer system 210 can be configured to perform at least one of the steps, operations, or actions described in the different illustrative examples using software, hardware, firmware, or a combination thereof. As a result, computer system 210 operates as a special purpose computer system in which process manager 214 in computer system 210 enables improved performance of quantum computers 202 within computer system 210. In particular, process manager 214 transforms computer system 210 into a special purpose computer system as compared to currently available general computer systems that do not have process manager 214.

In the illustrative example, the use of process manager 214 in computer system 210 integrates processes into a practical application for quantum computing that increases the performance of computer system 210. In other words, process manager 214 in computer system 210 is directed to a practical application of processes integrated into process manager 214 in computer system 210 that enables generating instructions 218 for quantum computers 202 in a manner that is more consistent and accurate as compared to current techniques. In this illustrative example, process manager 214 in computer system 210 uses digital model representations and quantum language translators to translate between different quantum programming languages in which one computer may have different hardware in a manner that is consistent and reproducible as compared to current techniques. In this manner, process manager 214 in computer system 210 provides a practical application of quantum computing in which a process for a quantum computer can be developed and automatically converted into instructions for quantum computers with different computer types. These instructions can include at least one of program code or circuit code identifying a circuit layout for the process.

The different features in the illustrative examples provide an ability to run processes on quantum computers with different computer types with increased accuracy and consistency as compared to current techniques. In the illustrative example, a process such as that for a quantum algorithm can be a digital model representation. This digital model representation can be used to automatically generate instructions such as program code or code for circuit layouts for different computer types in quantum computers. In other words, the different computer types may have different layouts and constraints as to how operations can be performed.

Further, in an illustrative example, supergates can be used to enable at least one of rapid or easy implementation of operations that form routines, subroutines, or functions in a process. The use of the supergates can remove tedious and error-prone manipulations as well as providing reusability of instructions. In the illustrative example, a process represented as a digital model representation can enable generation of instructions for specific types of hardware in quantum computers. A universal gate set can be specified for a digital model representation of a process in which the universal gate set is selected for a particular type of quantum computer. In this manner, the conversion of the digital model representation can be tailored to specific types of quantum computers using the quantum language translators in the illustrative examples. Further, in the illustrative example, the use of quantum language translators can reduce the number of program language conversions needed to create instructions for quantum computers having different computer types.

The illustration of quantum computing environment 200 in FIG. 2 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment. For example, quantum computers 202 can be separate components outside of computer system 210.

Figure 6:
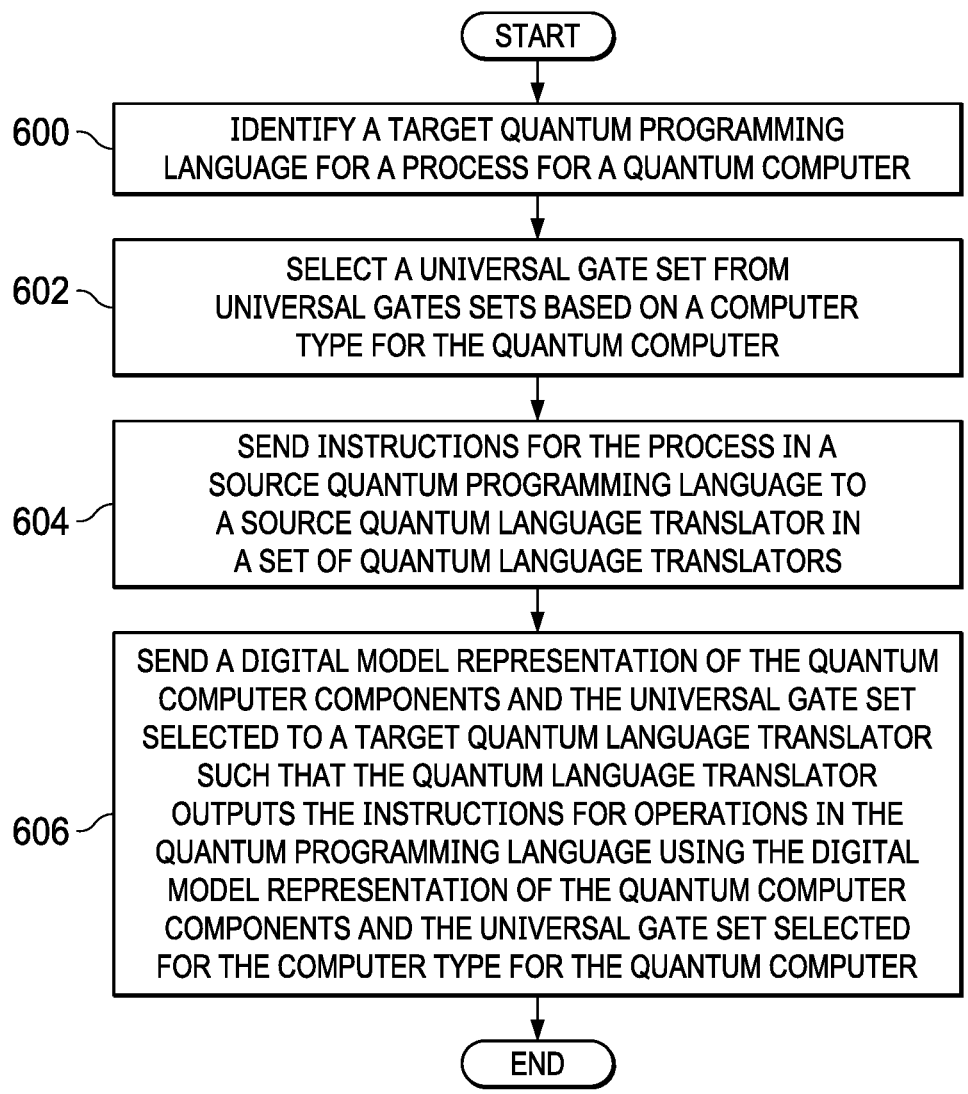
FIG. 6 is an illustration of a flowchart of a process for quantum processing in accordance with an illustrative embodiment.

Turning next to FIG. 6, an illustration of a flowchart of a process for quantum processing is depicted in accordance with an illustrative embodiment. The process in FIG. 6 can be implemented in hardware, software, or both. When implemented in software, the process can take the form of program code that is run by one or more processor units located in one or more hardware devices in one or more computer systems. For example, the process can be implemented in process manager 214 in computer system 210 in FIG. 2.

The process begins by identifying a target quantum programming language for a process for a quantum computer (operation 600). The process selects a universal gate set from universal gate sets based on a computer type for the quantum computer (operation 602). In operation 602, any operation possible for a particular quantum computer can be performed using a number of gates in the universal gate set that is selected.

The process sends instructions for the process in a source quantum programming language to a source quantum language translator in a set of quantum language translators (operation 604). The source quantum language translator in operation 604 outputs a digital model representation of quantum computer components that are arranged to perform the process using the instructions.

The process sends a digital model representation of the quantum computer components and the universal gate set selected to a target quantum language translator such that the quantum language translator outputs the instructions for operations in the target quantum programming language using the digital model representation of the quantum computer components and the universal gate set selected for the computer type for the quantum computer (operation 606). The process terminates thereafter.

Figure 7:
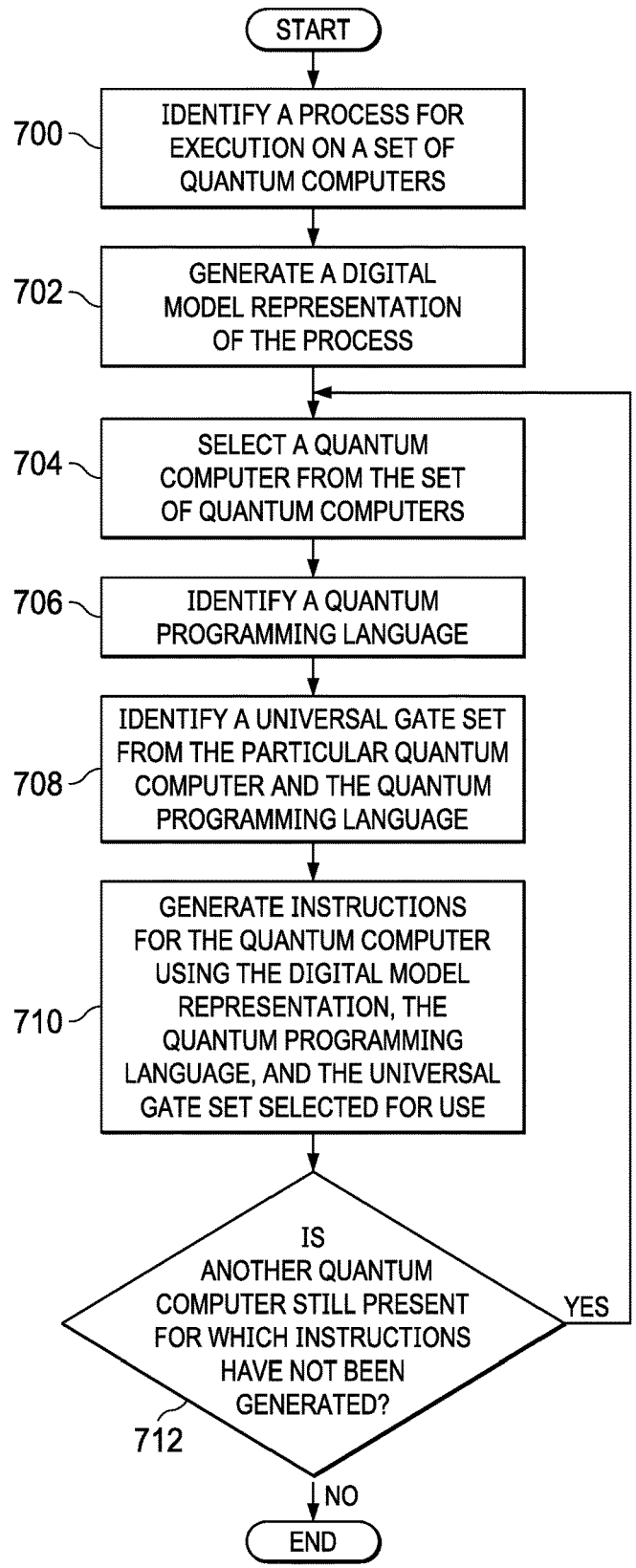
FIG. 7 is another illustration of a flowchart of a process for quantum processing in accordance with an illustrative embodiment.

Turning next to FIG. 7, another illustration of a flowchart of a process for quantum processing is depicted in accordance with an illustrative embodiment. The process in FIG. 7 can be implemented in hardware, software, or both. When implemented in software, the process can take the form of program code that is run by one or more processor units located in one or more hardware devices in one or more computer systems. For example, the process can be implemented in process manager 214 in computer system 210 in FIG. 2.

The process begins by identifying a process for execution on a set of quantum computers (operation 700). The process generates a digital model representation of the process (operation 702). In this illustrative example, the digital model representation generated in operation 702 can be generated a number of different ways.

For example, the process can be in the form of instructions in a quantum language that are translated into the digital model representation using a quantum language translator. In another illustrative example, the digital model representation can be created by user input received from a human machine interface.

In yet another illustrative example, the digital model representation can be generated from an initial digital model representation created by translation of instructions in a quantum programming language. The initial digital model representation can be modified through user input to the human machine interface to create the digital model representation of a process to be run on a set of quantum computers.

The process selects a quantum computer from the set of quantum computers (operation 704). The process identifies a quantum programming language (operation 706). The process identifies a universal gate set for the particular quantum computer and the quantum programming language (operation 708).

The process generates instructions for the quantum computer using the digital model representation, the quantum programming language, and the universal gate set selected for use (operation 710). The process determines whether another quantum computer is present for which instructions have not been generated (operation 712). If another quantum computer is present, the process returns to operation 704 as described above. Otherwise, the process terminates.

Figure 8:
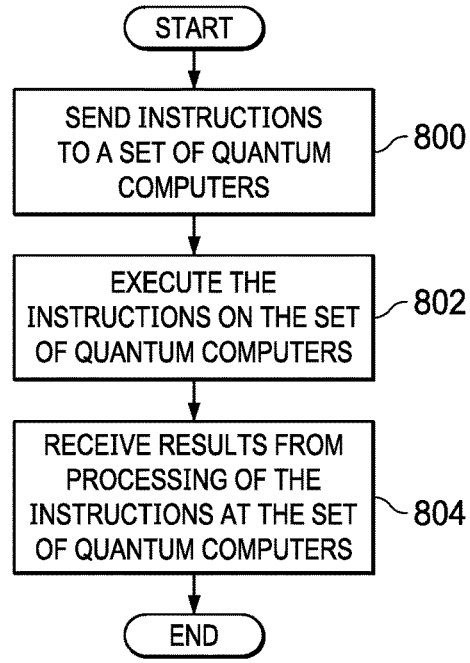
FIG. 8 is yet another illustration of a flowchart of a process for quantum processing in accordance with an illustrative embodiment.

Turning next to FIG. 8, another illustration of a flowchart of a process for quantum processing is depicted in accordance with an illustrative embodiment. The process in FIG. 8 can be implemented in hardware, software, or both. When implemented in software, the process can take the form of program code that is run by one or more processor units located in one or more hardware devices in one or more computer systems. For example, the process can be implemented in process manager 214 in computer system 210 in FIG. 2.

The operations in FIG. 8 are examples of additional operations that can be performed with the process in the flowchart in FIG. 8.

In this example, the process begins by sending instructions to a set of quantum computers (operation 800). The process then executes the instructions on the set of quantum computers (operation 802).

The process receives results from processing of the instructions at the set of quantum computers (operation 804). The process terminates thereafter.

The operations in the flowchart in FIG. 8 can be performed for a number of different purposes. For example, these operations can be performed for a benchmarking process in which instructions for the same process are run on different quantum computers. When the process is part of a benchmarking process, the instructions can be for benchmarking tests. The different parameters for a process can include at least one of processor execution time, memory used, processor resources used, accuracy compared to a known solution, probability of a correct solution compared to a known solution, error, noise, circuit execution time, or other suitable parameters.

In another illustrative example, the process distributed to the set of quantum computers is executed in the set of quantum computers to solve a portion of a problem. With this example, the quantum computers can be part of a grid computing system in which the process run on the quantum computers provide results for a solution to a problem.

Figure 9:
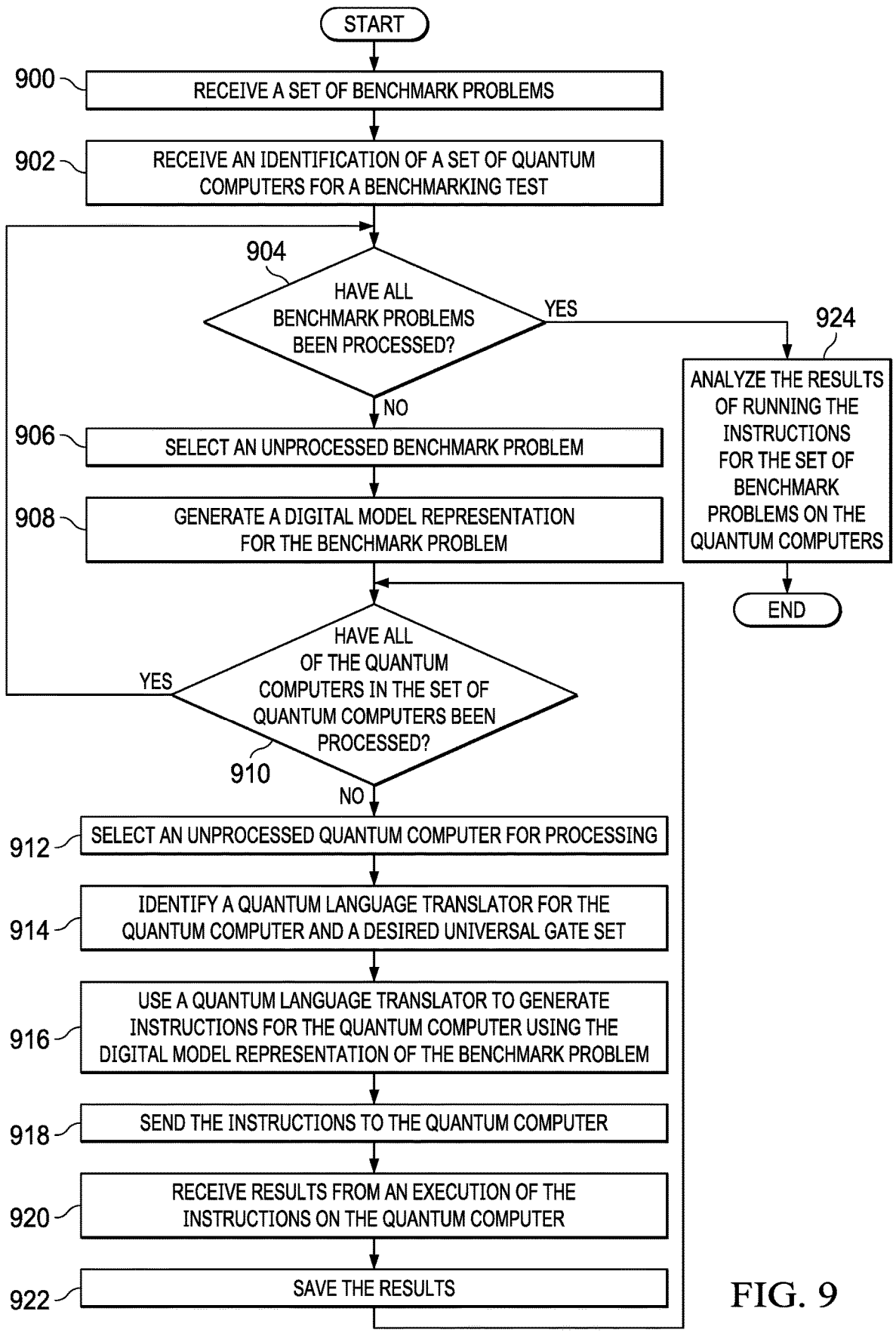
FIG. 9 is an illustration of a flowchart of a process for benchmarking quantum computers in accordance with an illustrative embodiment.

With reference now to FIG. 9, an illustration of a flowchart of a process for benchmarking quantum computers is depicted in accordance with an illustrative embodiment. The process in FIG. 9 can be implemented in hardware, software, or both. When implemented in software, the process can take the form of program code that is run by one or more processor units located in one or more hardware devices in one or more computer systems. For example, the process can be implemented in process manager 214 in computer system 210 in FIG. 2.

The process in FIG. 9 can be used to generate a set of instructions for a set of benchmark problems that are run by a set of quantum computers. The set of benchmark problems can be one or more benchmark problems depending on the implementation. This process can be run to benchmark one quantum computer or multiple quantum computers. With one computer, the results can be compared with results from prior benchmark tests.

These instructions can be run to obtain results for comparison of the quantum computers. In this example, translator output of quantum language translators is used to generate instructions for execution on the quantum computers from digital model representations of the processes implementing the benchmark problems.

The process begins by receiving a set of benchmark problems (operation 900). In this illustrative example, a benchmark problem in operation 900 can be at least one of benchmark optimization problems, quantum chemistry problems, materials problems, minimum eigenvalue problem, or other problems that can be run in a quantum computer. The process also receives an identification of a set of quantum computers for a benchmarking test (operation 902). In operation 902, when the set of quantum computers is more than one quantum computer, the quantum computers can be the same computer type with hardware differences, different computer types, or some combination thereof.

The process determines whether all benchmark problems in the set of benchmark problems have been processed (operation 904). If all of the benchmark problems have not been processed, the process selects an unprocessed benchmark problem (operation 906). The process generates a digital model representation for the benchmark problem (operation 908).

The process then determines whether all of the quantum computers in the set of quantum computers have been processed (operation 910). If all of the quantum computers have been processed, the process returns to operation 904. Otherwise, the process selects an unprocessed quantum computer for processing (operation 912). The process identifies a quantum language translator for the quantum computer and a desired universal gate set (operation 914). The quantum language translator is one that is for a particular language or computer type for a quantum computer.

For example, selection of the quantum language translator can be made using hardware database 249 in FIG. 2, similar to the universal gate set. Hardware database 249 can include an entry that maps a certain type of ion trap computer to both a universal gate set and a quantum programming language. In this depicted example, when a circuit layout is generated, the universal gate set can be looked up and used. If the digital model representation is to be converted into code in a programming language, the quantum programming language associated with the computer type for the quantum computer type can be looked up and used. Further, a list of programming languages supported by that computer system can be available for selection.

In another example, a human operator may want to see the corresponding instructions in a particular programming language. In this case, the human operator can generate user input that selects the programming language used to output instructions instead of using hardware database 249.

The process uses a quantum language translator to generate instructions for the quantum computer using the digital model representation of the benchmark problem (operation 916). In this illustrative example, the instructions can be at least one of program code in a programming language or circuit design code that define a circuit. In operation 916, the universal gate set can be input into the quantum language translator.

The process then sends the instructions to the quantum computer (operation 918). In operation 918, the quantum computer can be an actual physical computer or a simulation. The process receives results from an execution of the instructions on the quantum computer (operation 920). The process saves the results (operation 922). The process then returns to operation 910.

With reference again to operation 904, if all of the benchmark problems have been processed, the process analyzes the results of running the instructions for the set of benchmark problems on the quantum computers (operation 924). The process terminates thereafter.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step. For example, one or more of the blocks can be implemented as program code, hardware, or a combination of the program code and hardware. When implemented in hardware, the hardware can, for example, take the form of integrated circuits that are manufactured or configured to perform one or more operations in the flowcharts or block diagrams. When implemented as a combination of program code and hardware, the implementation may take the form of firmware. Each block in the flowcharts or the block diagrams can be implemented using special purpose hardware systems that perform the different operations or combinations of special purpose hardware and program code run by the special purpose hardware.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Figure 10:
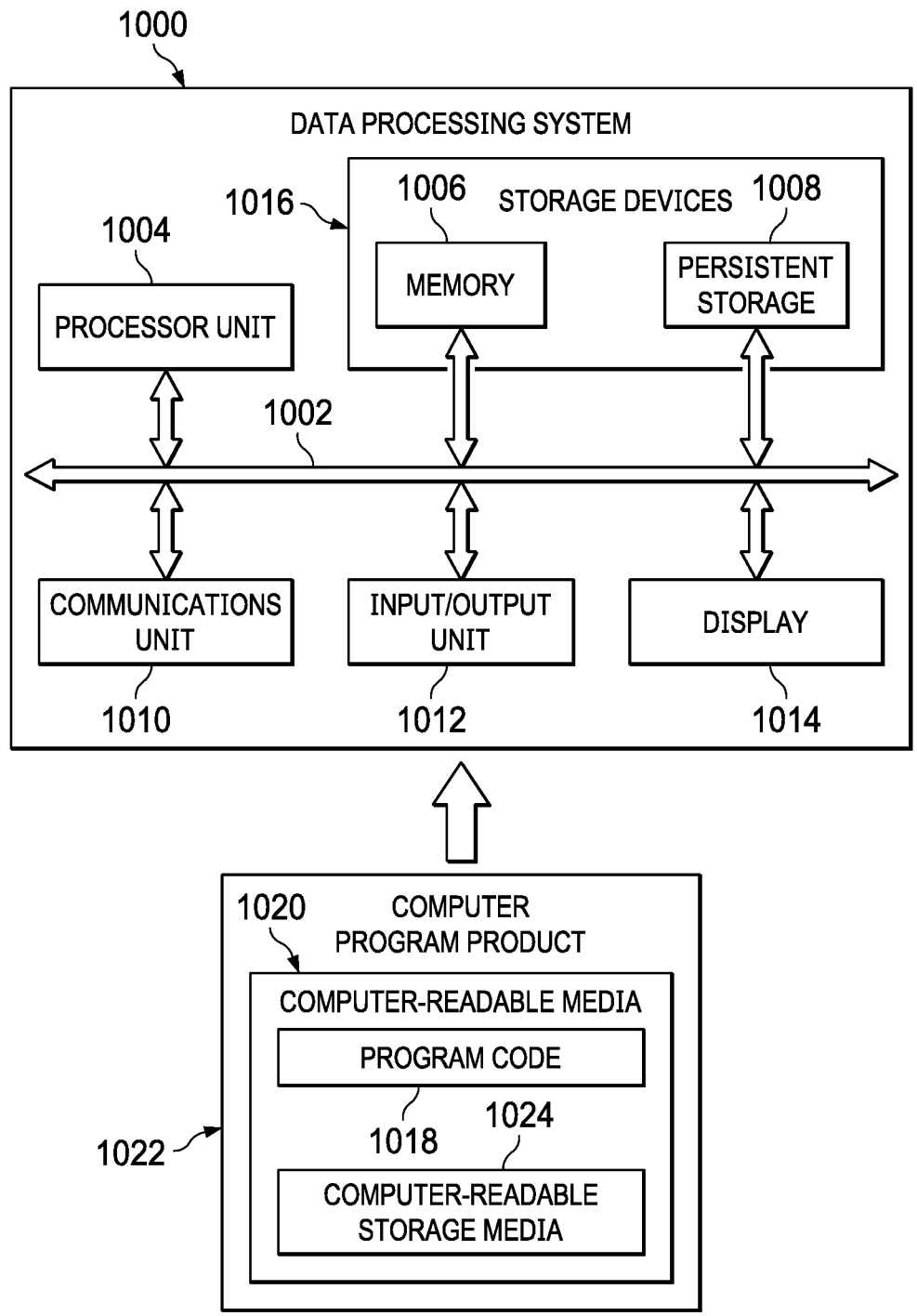
FIG. 10 is an illustration of a block diagram of a data processing system in accordance with an illustrative embodiment.

Turning now to FIG. 10, an illustration of a block diagram of a data processing system is depicted in accordance with an illustrative embodiment. Data processing system 1000 can be used to implement server computer 104, server computer 106, client devices 110, in FIG. 1. Data processing system 1000 can also be used to implement computer system 210 in FIG. 2. In this illustrative example, data processing system 1000 includes communications framework 1002, which provides communications between processor unit 1004, memory 1006, persistent storage 1008, communications unit 1010, input/output (I/O) unit 1012, and display 1014. In this example, communications framework 1002 takes the form of a bus system.

Processor unit 1004 serves to execute instructions for software that can be loaded into memory 1006. Processor unit 1004 includes one or more processors. For example, processor unit 1004 can be selected from at least one of a multicore processor, a central processing unit (CPU), a graphics processing unit (GPU), a physics processing unit (PPU), a digital signal processor (DSP), a network processor, or some other suitable type of processor. Further, processor unit 1004 can may be implemented using one or more heterogeneous processor systems in which a main processor is present with secondary processors on a single chip. As another illustrative example, processor unit 1004 can be a symmetric multi-processor system containing multiple processors of the same type on a single chip.

Memory 1006 and persistent storage 1008 are examples of storage devices 1016. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1016 may also be referred to as computer-readable storage devices in these illustrative examples. Memory 1006, in these examples, can be, for example, a random-access memory or any other suitable volatile or non-volatile storage device. Persistent storage 1008 can take various forms, depending on the particular implementation.

For example, persistent storage 1008 may contain one or more components or devices. For example, persistent storage 1008 can be a hard drive, a solid-state drive (SSD), a flash memory, a rewritable optical disk, a rewritable magnetic tape, or some combination of the above. The media used by persistent storage 1008 also can be removable. For example, a removable hard drive can be used for persistent storage 1008.

Communications unit 1010, in these illustrative examples, provides for communications with other data processing systems or devices. In these illustrative examples, communications unit 1010 is a network interface card.

Input/output unit 1012 allows for input and output of data with other devices that can be connected to data processing system 1000. For example, input/output unit 1012 can provide a connection for user input through at least one of a keyboard, a mouse, or some other suitable input device. Further, input/output unit 1012 can send output to a printer. Display 1014 provides a mechanism to display information to a user.

Instructions for at least one of the operating system, applications, or programs can be located in storage devices 1016, which are in communication with processor unit 1004 through communications framework 1002. The processes of the different embodiments can be performed by processor unit 1004 using computer-implemented instructions, which can be located in a memory, such as memory 1006.

These instructions are referred to as program code, computer usable program code, or computer-readable program code that can be read and executed by a processor in processor unit 1004. The program code in the different embodiments can be embodied on different physical or computer-readable storage medium, such as memory 1006 or persistent storage 1008.

Program code 1018 is located in a functional form on computer-readable media 1020 that is selectively removable and can be loaded onto or transferred to data processing system 1000 for execution by processor unit 1004. Program code 1018 and computer-readable media 1020 form computer program product 1022 in these illustrative examples. In the illustrative example, computer-readable media 1020 is computer-readable storage media 1024.

In these illustrative examples, computer-readable storage media 1024 is a physical or tangible storage device used to store program code 1018 rather than a medium that propagates or transmits program code 1018. Computer readable storage media 1024, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Alternatively, program code 1018 can be transferred to data processing system 1000 using a computer-readable signal media. The computer-readable signal media can be, for example, a propagated data signal containing program code 1018. For example, the computer-readable signal media can be at least one of an electromagnetic signal, an optical signal, or any other suitable type of signal. These signals can be transmitted over connections, such as wireless connections, optical fiber cable, coaxial cable, a wire, or any other suitable type of connection.

Further, as used herein, "computer-readable media 1020" can be singular or plural. For example, program code 1018 can be located in computer-readable media 1020 in the form of a single storage device or system. In another example, program code 1018 can be located in computer-readable media 1020 that is distributed in multiple data processing systems. In other words, some instructions in program code 1018 can be located in one data processing system while other instructions in program code 1018 can be located in one data processing system. For example, a portion of program code 1018 can be located in computer-readable media 1020 in a server computer while another portion of program code 1018 can be located in computer-readable media 1020 located in a set of client computers.

The different components illustrated for data processing system 1000 are not meant to provide architectural limitations to the manner in which different embodiments can be implemented. In some illustrative examples, one or more of the components may be incorporated in or otherwise form a portion of, another component. For example, memory 1006, or portions thereof, can be incorporated in processor unit 1004 in some illustrative examples. The different illustrative embodiments can be implemented in a data processing system including components in addition to or in place of those illustrated for data processing system 1000. Other components shown in FIG. 10 can be varied from the illustrative examples shown. The different embodiments can be implemented using any hardware device or system capable of running program code 1018.

Thus, the illustrative examples provide a method, apparatus, system, and program code for quantum computing. In one illustrative example, a method is present for quantum processing. A target quantum programming language for a process for a quantum computer is identified by a computer system. A universal gate set is selected by the computer system from universal gate sets based on a computer type for the quantum computer, wherein any operation possible for a particular quantum computer can be performed using a number of gates in the universal gate set. Instructions for the process in a source quantum programming language are sent by the computer system to a source quantum language translator in a set of quantum language translators, wherein the source quantum language translator outputs a digital model representation of quantum computer components that are arranged to perform the process using the instructions. The digital model representation of the quantum computer components and the universal gate set selected are sent by the computer system to a target quantum language translator such that the quantum language translator outputs the instructions for the operations in the target quantum programming language using the digital model representation of the quantum computer components and the universal gate set selected for the computer type for the quantum computer.

The different features in the illustrative examples provide an ability to run processes on quantum computers of different computer types with increased accuracy and consistency as compared to current techniques. In the illustrative example, a process such as that for a quantum algorithm can be a digital model representation. This digital model representation can be used to automatically generate instructions such as program code or code for circuit layouts for different computer types in quantum computers. In other words, the different computer types may have different layouts and constraints as to how operations can be performed.

Further, the illustrative example includes supergates that enable rapid and easy implementation of routines, subroutines, or functions in a process. In another illustrative example, the representation of a process in a digital model representation can enable generation of instructions for specific types of hardware in quantum computers. In the illustrative example, a universal gate set can be specified for a digital model representation of a process. In this manner, the conversion of the digital model representation can be tailored to specific types of quantum computers using the quantum language translators in the illustrative examples.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, to the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A quantum processing system comprising:
   a computer system;
   a set of quantum language translators in the computer system, wherein the set of quantum language translators are configured to convert instructions for operations in source quantum programming languages into a digital model representation of quantum computer components arranged to perform the operations and to convert the digital model representation of the quantum computer components arranged to perform the operations into the instructions for the operations in target quantum programming languages for execution in quantum computers, wherein each quantum language translator in the set of quantum language translators is for a particular quantum programming language in the source and target quantum programming languages;
   universal gate sets, wherein any operation possible for a particular quantum computer can be performed using a number of gates in a universal gate set in the universal gate sets; and
   a process manager in the computer system, wherein the process manager is configured to:
      send the instructions in a source quantum programming language to a source quantum language translator in the set of quantum language translators, wherein the quantum language translator is configured to handle the source quantum programming language and outputs the digital model representation of the quantum computer components;
      simulate the operation of the digital model representation of the quantum computer components arranged to perform the operations; and
      send the digital model representation of the quantum computer components to a target quantum language translator such that the target quantum language translator outputs the instructions for the operations in a target quantum programming language using the universal gate set selected for a computer type for the particular quantum computer.

2. The quantum processing system of claim 1, wherein the process manager is configured to determine the universal gate set in the universal gate sets selected, and wherein the universal gate set that is selected provides a desired level of performance for a particular quantum computer.

3. The quantum processing system of claim 1, wherein selection of the universal gate set is sent with the instructions to the quantum language translator.

4. The quantum processing system of claim 1, wherein the universal gate sets are selected from at least one of Hadamard gates, phase (S) gates, Controlled-X (CNOT) gates, and Toffoli gates; Hadamard gates, phase (S) gates, $\pi/8$ (T) gates, and a Controlled-X (CNOT) gates; a Barenco gate (B); a Deutsch gate ($D\_\theta$) gate; rotation gates $R\_x\ (\theta)$, $R\_y\ (\theta)$; rotation gates $R\_x\ (\theta)$, $R\_y\ (\theta)$; or a Controlled-Z (CZ) gate.

5. The quantum processing system of claim 1, wherein the quantum language translator comprises:
   a translator input configured to receive the instructions in the quantum programming language sent to the quantum language translator in the set of quantum language translators and output the digital model representation of the quantum computer components; and
   a translator output configured to receive the digital model representation of the quantum computer components sent to the quantum language translator and output the instructions for the operations in the quantum programming language.

6. A quantum processing system comprising:
a computer system;
a set of quantum language translators in the computer system, wherein the set of quantum language translators is configured to convert instructions for operations in source quantum programming languages into a digital model representation of quantum computer components arranged to perform the operations and to convert the digital model representation of the quantum computer components arranged to perform the operations into the instructions for the operations in target quantum programming languages for execution in quantum computers, wherein each quantum language translator in the set of quantum language translators is for a particular quantum programming language in the source and target quantum programming languages; and
a process manager in the computer system, wherein the process manager is configured to:
receive the instructions in a source quantum programming language in the quantum programming languages;
send the instructions in the source quantum programming language to a source quantum language translator in the set of quantum language translators, wherein the quantum language translator is configured to handle the source quantum programming language and outputs the digital model representation of the quantum computer components;
simulate the operation of the digital model representation of the quantum computer components arranged to perform the operations; and
send the digital model representation of the quantum computer components to target quantum language translator such that the target quantum language translator outputs the instructions for the operations in a target quantum programming language.

7. The quantum processing system of claim 6 further comprising:
universal gate sets, wherein any operation possible for a particular quantum computer can be performed using a number of gates in a universal gate set in the universal gate sets.

8. The quantum processing system of claim 7, wherein the process manager is configured to select the universal gate set in the universal gate sets, and wherein the universal gate set selected provides a desired level of performance for a particular quantum computer.

9. The quantum processing system of claim 8, wherein an identification of the universal gate set selected is sent with the instructions to the quantum language translator.

10. The quantum processing system of claim 7, wherein the universal gate sets are selected from at least one of Hadamard gates, phase (S) gates, Controlled-X (CNOT) gates, and Toffoli gates; Hadamard gates, phase (S) gates, π/8 (T) gates, and a Controlled-X (CNOT) gate; a Barenco gate (B); a Deutsch gate (D_θ) gate; rotation gates R_x (θ), R_y (θ); rotation gates R_x (θ), R_y (θ); or a Controlled-Z (CZ) gate.

11. The quantum processing system of claim 6, wherein the quantum language translator comprises:
a translator input configured to receive the instructions in the quantum programming language sent to the quantum language translator in the set of quantum language translators and output the digital model representation of the quantum computer components; and
a translator output configured to receive the digital model representation of the quantum computer components sent to the quantum language translator and output the instructions for the operations in the quantum programming language.

12. The quantum processing system of claim 6, wherein the quantum computer components comprise gates.

13. The quantum processing system of claim 12, wherein the quantum computer components further comprises at least one of a qubit model, a memory model, a memory state, or a quantum programming.

14. The quantum processing system of claim 12, wherein the gates include a number of supergates.

15. The quantum processing system of claim 6, wherein the quantum computer is selected from one of a superconducting quantum computer and an ion trap quantum computer.

16. The quantum processing system of claim 6, wherein the instructions are for one of an application, a program, and a subroutine.

17. A method for quantum processing, the method comprising:
identifying, by a computer system, a target quantum programming language for a process for a quantum computer;
selecting, by the computer system, a universal gate set from universal gate sets based on a computer type for the quantum computer, wherein any operation possible for a particular quantum computer can be performed using a number of gates in the universal gate set;
sending, by the computer system, instructions for the process in a source quantum programming language to a source quantum language translator in a set of quantum language translators, wherein the source quantum language translator outputs a digital model representation of quantum computer components that are arranged to perform the process using the instructions;
simulating, by a process manager in the computer system, the operation of the digital model representation of the quantum computer components arranged to perform the operations; and
sending, by the computer system, the digital model representation of the quantum computer components and the universal gate set selected to a target quantum language translator such that the quantum language translator outputs the instructions for operations for the process in the target quantum programming language using the digital model representation of the quantum computer components and the universal gate set selected for the computer type for the quantum computer.

18. The method of claim 17, wherein selecting the universal gate set from the universal gate sets based on the computer type for the quantum computer comprises:
selecting, by the computer system, the universal gate set in the universal gate sets that provides a desired level of performance for the computer type for the quantum computer.

19. The method of claim 17, wherein the universal gate sets are selected from at least one of Hadamard gates, phase (S) gates, Controlled-X (CNOT) gates, and Toffoli gates; Hadamard gates, phase (S) gates, π/8 (T) gates, and Controlled-X (CNOT); a Barenco gate (B); a Deutsch gate (D_θ) gate; rotation gates R_x (θ), R_y (θ); rotation gates R_x (θ), R_y (θ); or a Controlled-Z (CZ) gate.

20. The method of claim 17 further comprising:
executing, by the computer system, the instructions in the target quantum programming language, in the quantum computer.

21. The method of claim 17, wherein the quantum language translator comprises:
a translator input configured to receive the instructions in a quantum programming language sent to the quantum language translator in the set of quantum language translators and output the digital model representation of the quantum computer components; and
a translator output configured to receive the digital model representation of the quantum computer components sent to the quantum language translator and output the instructions for the operations in the quantum programming language.

22. The method of claim 17, wherein the quantum computer components comprise gates.

23. The method of claim 22, wherein the quantum computer components further comprises at least one of a qubit model, a memory model, a memory state, or a quantum programming.

24. The method of claim 22, wherein the gates include a number of supergates.

25. The method of claim 17, wherein the quantum computer is selected from one of a superconducting quantum computer and an ion trap quantum computer.

26. The method of claim 17, wherein the instructions are for one of an application, a program, and a subroutine.

27. A computer program product for quantum processing, the computer program product comprising:
a computer-readable storage media;
first program code, stored on the computer-readable storage media, executable by a computer system to cause the computer system to identify a target quantum programming language for a process for a quantum computer;
second program code, stored on the computer-readable storage media, executable by the computer system to cause the computer system to select a universal gate set from universal gate sets based on a computer type for the quantum computer, wherein any operation possible for a particular quantum computer can be performed using a number of gates in the universal gate set;
third program code, stored on the computer-readable storage media, executable by the computer system to cause the computer system to send instructions for the process in a source quantum programming language to a source quantum language translator in a set of quantum language translators, wherein the source quantum language translator outputs a digital model representation of quantum computer components that are arranged to perform the process using the instructions;
fourth program code, stored on the computer-readable storage media, executable by the computer system to cause the computer system to simulate the operation of the digital model representation of the quantum computer components arranged to perform the operations; and
fifth program code, stored on the computer-readable storage media, executable by the computer system to cause the computer system to send the digital model representation of the quantum computer components and the universal gate set selected to a target quantum language translator such that the quantum language translator outputs the instructions for operations for the process in the target quantum programming language using the digital model representation of the quantum computer components and the universal gate set selected for the computer type for the quantum computer.

28. The computer program product of claim 27, wherein second program code comprises:
program code, stored on the computer-readable storage media, executable by the computer system to cause the computer system to select the universal gate set in the universal gate sets that provides a desired level of performance for the computer type for the quantum computer.

29. The computer program product of claim 27, wherein the universal gate sets are selected from at least one of Hadamard gates, phase (S) gates, Controlled-X (CNOT) gates, and Toffoli gates; Hadamard gates, phase (S) gates, π/8 (T) gates, and a Controlled-X (CNOT) gate; a Barenco gate (B); a Deutsch gate (D_θ) gate; rotation gates R_x (θ), R_y (θ); rotation gates R_x (θ), R_y (θ); or a Controlled-Z (CZ) gate.

30. The quantum processing system of claim 1, wherein the quantum computer is selected from one of a superconducting quantum computer and an ion trap quantum computer.

* * * * *